(12) United States Patent
Pietruszynski et al.

(10) Patent No.: US 6,650,614 B1
(45) Date of Patent: Nov. 18, 2003

(54) OPTICAL DISK PICKUP USING CURRENT MODE SIGNAL EXCHANGES AND SYSTEMS AND METHODS USING THE SAME

(75) Inventors: David Michael Pietruszynski, Austin, TX (US); Rex Baird, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 404 days.

(21) Appl. No.: 09/702,240

(22) Filed: Oct. 30, 2000

(51) Int. Cl.[7] ................................................ G11B 7/00
(52) U.S. Cl. ................ 369/124.1; 369/120; 369/112.27
(58) Field of Search ........................ 369/44.41, 44.42, 369/124.01, 120, 124.1, 124.12, 112.27

(56) References Cited

U.S. PATENT DOCUMENTS

| | | | |
|---|---|---|---|
| 5,287,340 A | * 2/1994 | Chapman | 369/44.41 |
| 5,392,000 A | * 2/1995 | Gillig | 330/107 |
| 5,742,046 A | * 4/1998 | Reele | 250/214 |
| 5,796,689 A | * 8/1998 | Houmoto et al. | 369/44.41 |
| 6,069,866 A | * 5/2000 | Pietruszynski et al. | 369/124 |

* cited by examiner

*Primary Examiner*—Nabil Hindi
(74) *Attorney, Agent, or Firm*—James J. Murphy; Winstead Sechrest & Minick P.C.

(57) ABSTRACT

An optical disk pickup system includes an array of photodiodes 101 for converting photons reflected from an optical disk into a plurality of electrical signals each representing a channel. Driving circuitry 407, 408 drives at least one of the electrical signals as a current across a conductor of a flexible cable 403. A low impedance load 404 converts the electrical signal driven across the conductor as a current into a voltage for further processing.

5 Claims, 2 Drawing Sheets

OPTICAL DISK PICKUP USING CURRENT MODE SIGNAL EXCHANGES AND SYSTEMS AND METHODS USING THE SAME

CROSS-REFERENCE TO RELATED APPLICATION

The following and co-assigned application contains related information and is hereby incorporated by reference: Ser. No. 08/956,569, entitled "SYSTEMS AND METHOD FOR CONTROL OF LOW FREQUENCY INPUT LEVELS TO AN AMPLIFIER AND COMPENSATION OF INPUT OFFSETS OF THE AMPLIFIER" filed Oct. 23, 1997;

Ser. No. 09/703,315, entitled "OPTICAL DISC. PICKUP SYSTEM USING CURRENT DIVISION SIGNAL TRANSMISSION AND METHODS AND OPTICAL DISK SYSTEMS USING THE SAME, filed Oct. 31, 2000, granted Jul. 9, 2002 under U.S. Pat. No. 6,418,110;

Ser. No. 09/282,121, entitled "CIRCUITS AND METHODS FOR EXCHANGING SIGNALS IN OPTICAL DISK SYSTEMS AND SYSTEMS USING THE SAME", filed Mar. 31, 1999, currently pending;

Ser. No. 09/282,840, entitled "CIRCUITS AND METHODS FOR GAIN RANGING IN AN ANALOG MODULATOR AND SYSTEMS USING THE SAME", filed Mar. 31, 1999, currently pending;

Ser. No. 09/282,841, entitled "A FLEXIBLE INTERFACE SIGNAL FOR USE IN AN OPTICAL DISK SYSTEM AND SYSTEMS AND METHODS USING THE SAME", filed Mar. 31, 1999, currently pending; and

BACKGROUND OF THE INVENTION

Ser. No. 09/282,849, entitled "SERVO CONTROL LOOPS UTILIZING DELTA-SIGMA ANALOG TO DIGITAL CONVERTERS AND SYSTEMS AND METHODS USING THE SAME" filed Mar. 31, 1999, currently pending.

1. Field of the Invention

The present invention relates in general to optical disk systems and in particular to an optical disk pickups using current mode signal exchanges and systems and methods using the same.

2. Description of the Art

Optical disks have been used for many years for the mass storage of digital data. Some well known examples of optical disks include digital audio compact disks (CD-DAs), compact disk read-only memories (CD-ROMs) and digital video disks (DVD-RAMs, -ROM, +RW, -RW, CD-R, CD-RWs). Essentially, digital data is stored on a plastic disk with a reflective surface as a series of pits and land in the reflective surface (land). During playback, a beam of light is directed to the rotating reflective surface and the intensity of the photons reflected from the pits and land are measured. A modulated electrical signal is generated that can be processed and the data stored on the disk recovered.

A basic configuration for the read (playback) mechanism has developed over a number of years. This configuration includes a pickup or sled which is movable so that a laser, a lens, and array of photodiodes can be positioned directly over the data being read off of the disk. As the disk turns, the photons from the laser are reflected off the pits and land and received by the photodiodes which generate electrical signals having a current that is proportional to photon density. The multiple signals output from the photodiodes represent both data detection and servo alignment information.

The summation of the high speed data channel signal, which may be composed of the signals A+B+C+D from an astigmatic photodiode array, results in a composite signal with relevant information between approximately 10 KHz and 60 MHz for current DVD players. Servo information contained in these signals however, is at frequencies less than 1 MHz down to dc (for current spindle rotation rates of <6000 RPM). Because of these information rates, the data channel signal is sometimes AC-coupled to the data detection and summation circuitry mounted on an accompanying stationary circuit board. Otherwise, some degradation of the dynamic range must be accepted due to the dc content of the incoming signal.

The typical current signal generated by a photodiode is on the order of 1 $\mu A$. Transferring this signal directly down a flexible cable to the stationary circuit board can seriously degrade the signal to noise ratio due to magnetic or electrical interference. Hence, transimpedance amplifiers, which convert the current from the photodiode array into a voltage for driving the cable, are mounted in the pickup to minimize noise and interference effects. The data detection, error correction, and servo systems are kept off of the pickup primarily to reduce the physical size and mass of the sled.

One of the primary concerns about transferring data across the flexible cable as a voltage is maintaining a good signal to noise ratio, in the presence of interference. A good signal to noise ratio can be achieved by insuring that the output of the pickup electronics are driven across the flexible cable using a sufficiently high supply voltage. Notwithstanding, it would be desirable to be able to reduce the supply voltage to save power; however, to do so would reduce the amplitude of the signals being transmitted across the cable and hence reduce the signal to noise ratio. What is needed therefore are methods and circuitry which maintain the signal to noise ratio for signals being transmitted across the flexible cable, even if the supply voltage is reduced.

SUMMARY OF THE INVENTION

An optical disk pickup system is disclosed including an array of photodiodes for converting photons reflected from an optical disk into a plurality of electrical signals each representing a channel. Driving circuitry is provided for driving at least one of the electrical signals as a current across a conductor of a flexible cable. A low impedance load converts the electrical signal driven across the conductor as a current into a voltage for further processing.

The present inventive teachings provide a number of advantages over the prior art. Among other things, by driving the flexible cable using current rather than a voltage, the voltage on the supply rails can be reduced significantly. Specifically, the voltage headroom can be reduced without substantially affecting the signal to noise ratio. Moreover, data and servo control signals being transmitted can be easily summed to reduce the number of conductors required on the system flexible cable, also without exceeding the available voltage headroom.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

The principles of the present invention and their advantages are best understood by referring to the illustrated embodiment depicted in FIGS. 1–4 of the drawings, in which like numbers designate like parts.

Figure 1:
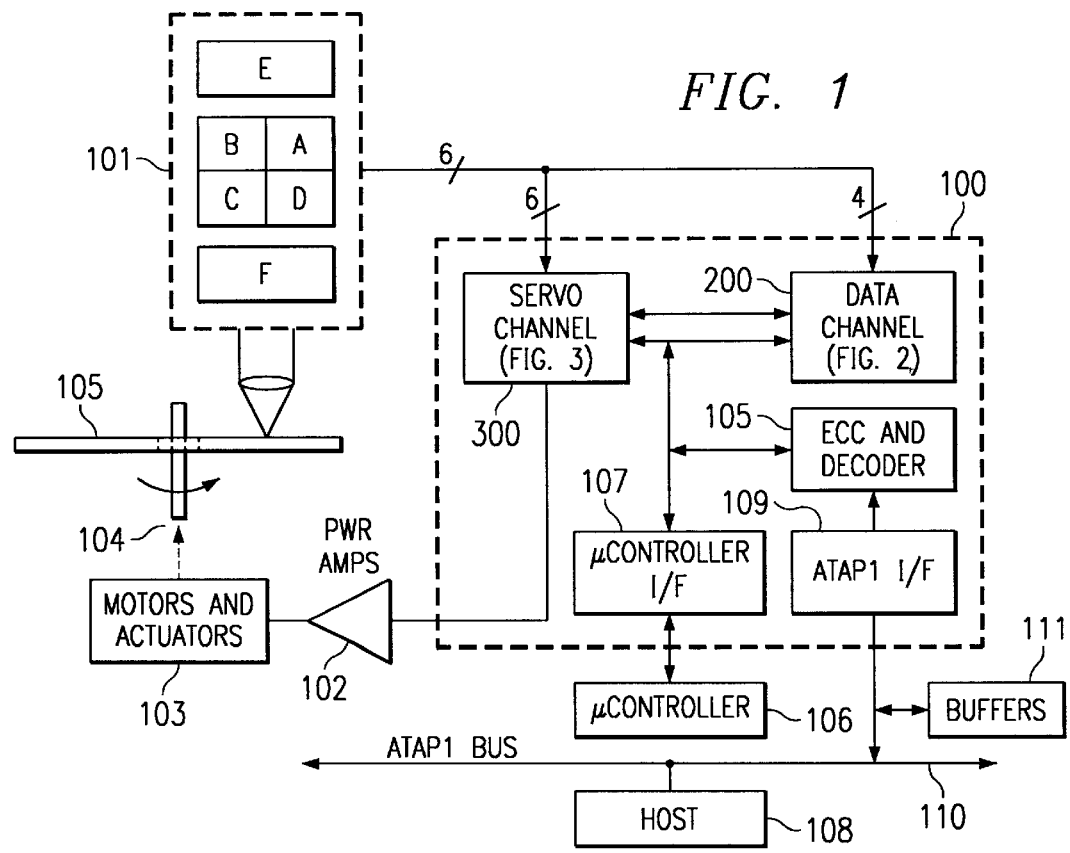
FIG. 1 is a conceptual diagram of an exemplary personal computer based optical disk playback system.

FIG. 1 is a conceptual diagram of an exemplary personal computer (PC) based optical disk playback system including a drive manager integrated circuit (IC or "chip") 100 embodying the present inventive concepts. It should be recognized however that IC 100 can also be used with CD or DVD players and DVD RAM systems. In addition to chip 100, the system also includes optical pickup 101, including the requisite laser, photodiode array and transimpedance amplifiers, and the power amplifiers 102 and motors & actuators 103 which control the player spindle 104 rotation and pickup 101 movement and alignment. In the preferred embodiment, drive manager chip 100 embodies decoding circuitry for processing data from either DVD-ROM, CD-ROM or CD-DA optical disks.

There are two principal processing paths, one each for the servo and data channels, the inputs of which are driven by the transimpedance amplifiers on optical pickup 101. The servo path is shown generally at 300 and the data path generally at 200. Each of these paths will be discussed in further detail below in conjunction with FIGS. 3 and 2 respectively. The output of the data channel is passed through ECC and Decoder 105 for additional processing such as error correction and content descrambling.

Local control is implemented by microcontroller 106 through microcontroller interface 107. Typically, local microcontroller 106 is user supplied for maximum flexibility and generally provides the instructions directing the on-board processors and error correction circuitry.

Chip 100 additionally communicates with a host processor 108 via an ATAPI bus interface 109 and ATAPI bus 110, in the case of a PC-based system. The host performs the actual processing of the audio/video information or data retrieved from the disk after error correction and buffering by chip 100. Among other things, the host performs audio and video MPEG decoding and generates the corresponding user interface. Buffers (DRAM) 111 support error correction functions and the streaming of data from chip 100 to host 108.

Figure 2:
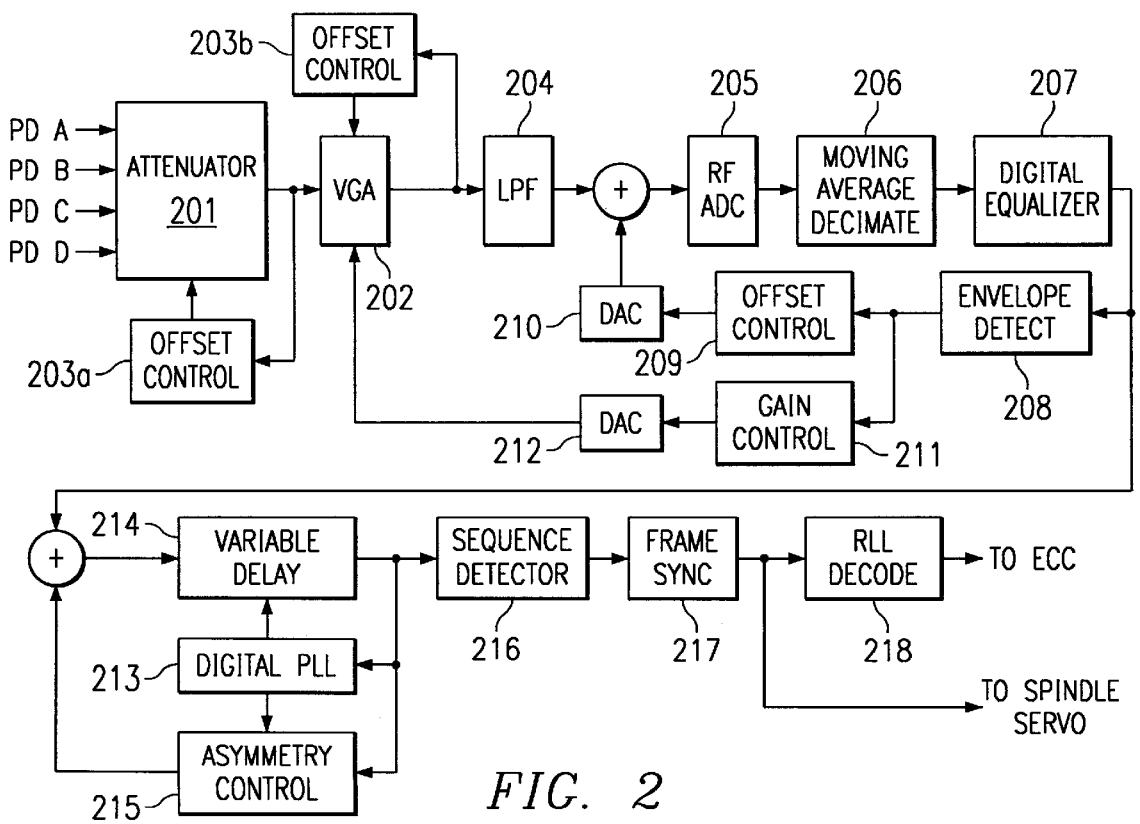
FIG. 2 is a detailed functional block diagram of the data path shown in FIG. 1.

Referring to FIG. 2 which is a detailed functional block diagram of data path 200, attenuators 201 are used in the preferred embodiment to protect the inputs of the following VGAs from damage from any over-voltages produced by the pickup. Offset controls 203a and 203b allow the digital offset control loop discussed below to respond to dc and low frequency baseline offsets in attenuators 201 and VGAs 202.

Data channel summation and variable gain amplifier (VGA) circuitry 202 add one or more signals from the transimpedance amplifiers on pickup 101 to form a composite data signal (e.g., A+B+C+D). Alternatively, the signal addition may be done right on pickup 101, either electrically or optically. The VGA gain is controlled by automatic gain control loops, also discussed below.

A low pass filter (LPF) 204 provides anti-aliasing for flash analog to digital converter 205. A digital moving average of the output of ADC 205 is taken and filter 206 applied to reject noise and interference in the Nyquist bandwidth, as well as perform a decimation. It should be noted that any one of a number of other types of filters can be used to achieve the same result. The decimating filter 206 can also be used to lower the effective sampling rate of the data for subsequent digital data processing. The data is then digitally equalized using a multiple-tap finite impulse response (FIR) filter 207 adjustable to differing data rates and disk reflectivity. Advantageously, the front-end analog circuits are simplified since data is immediately digitized and the necessary equalization is performed digitally.

Automatic offset control is implemented by the loop including envelope detectors 208, offset controls 209 and DAC 210. Envelope detectors 208 detect both the top and bottom envelopes of the high speed data signal. These envelopes are summed to produce an error signal which is passed through an offset loop compensation filter within offset control block 209 and integrated. The output of the loop compensation filter is converted to analog form by DAC 210 and summed with the output of LPF 204.

Gain control loop 211 also takes the difference between the amplitudes of top and bottom detected envelopes and subtracts a pre-programmed gain value. A gain loop compensation filter integrates the results and produces a linearized signal which is converted by DAC 212 to analog form and passed to VGAs 202 to adjust the signal gain.

An interpolating digital phased-locked loop (DPLL)213 retimes the data after ADC sampling and digital equalization. DPLL 213 operates on sampled amplitudes and generally includes a digital phase error detector, digital loop compensation filter, and digital frequency to phase integrator (digital VCO). Variable delay filter 214 interpolates the asynchronous digital samples to ideal synchronously sampled samples at the front of the DPLL. The phase detector then generates an error signal using a stochastic process which compares the incoming data with ideal target sampling values without noise. The error signal is multiplied by the derivative of the target data to produce phase error estimates. The loop compensation filter performs a proportional integration and the result is sent to variable delay filter 214 to adjust the delay and correct for phase errors.

Advantageously, digital PLL 213 allows the ADC and equalizer to operate at a fixed asynchronous sample rate to the data.

Asymmetry control circuitry 215 includes a control loop which corrects the read errors from the optical pickup. The errors are detected using either the slicer duty cycle or zero crossing errors. The errors are then scaled and integrated by a compensation filter and the resulting compensation signal summed at the input to variable delay filter 214.

The retimed data is then processed by a maximum likelihood sequence detector 216. The partial response equalization target assumed in this detector is $G(D)=1+D+D^2+D^3$. Other targets may be used in alternate embodiments.

The output of sequencer 216 is synchronized by frame synchronization circuitry 217 and then passed to Run Length Limit ("RLL") decoder 218. RLL code embedded in the disk is used as an indication of disk defects. Generally, a state machine checks for violation of the RLL code "k-constraint"

and failures in synchronization and then causes the data channel to "coast" through the defect and then resynchronizes the data stream.

Automatic Zone Control (AZC) logic (not shown) takes advantage of the digital nature of the data channel by initializing subsystems based on data rate. For example, the tap weights and tap spacing of the digital equalizer are set to correspond to one of six incoming data rates. Similarly, the loop coefficients, and hence the loop dynamics, of interpolating digital PLL 213 are controlled by the AZC logic.

In sum, the data channel is a bandpass system with signals in the 10 kHz to 60 MHz range. The signal spectrum below 10 kHz is either servo information or external dc offsets from the pickup electronics. The presence of this information reduces the dynamic range of the data channel. Using an off-chip ac coupling capacitor would reduce the dc offset but blocks the low frequency servo information. Instead, the dc signal is brought on-chip and a control loop performs the effective ac coupling for the data channel. Not only are external coupling capacitors unnecessary, but defect detection by the downstream digital processing can freeze this control loop when a defect is reached, unlike an ac coupled system where the baseline wanders. The offset and AGC loops are also frozen until data transitions are detected.

Co-pending and co-assigned application Ser. No. 08/956, 567, entitled "SYSTEM AND METHOD FOR CONTROL OF LOW FREQUENCY INPUT LEVELS TO AN AMPLIFIER AND COMPENSATION OF INPUT OFFSETS OF THE AMPLIFIER" filed Oct. 23, 1997 contains related information and is hereby incorporated by reference.

Decoder block 105 (FIG. 1) manages the flow of data between the data channel and external DRAM buffer 111 and manages PC host ATAPI interface 109. The ECC circuitry performs realtime ECC correction for DVD data and layered ECC correction for CD-ROM data. Additionally 8–14 demodulation is provided for DVD data and EFM demodulation for error correction and deleaving of CD-DA and CD-ROM data. A burst cutting area (BCA) decoder is built-in chip 100 for DVD-ROM applications. DVD Navigation Play for DVD player operations is supported along with Content Scramble System circuitry for descrambling DVD data which has been scrambled under the Content Scramble System. The error correction and decoding functions are supported by on-chip SRAM.

Figure 3:
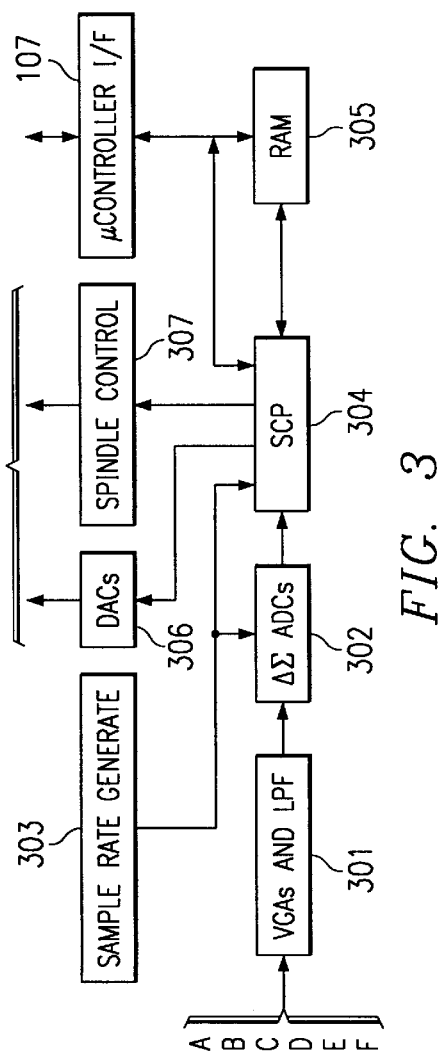
FIG. 3 is a diagram showing further detail of the servo control path shown in FIG. 1.

As indicated above, the second principal signal path of the chip 100 controls servo operation and is shown generally at 300 in FIG. 1 and in further detail in FIG. 3. The integrated servo system operates four control loops: focus, tracking, sled, and spindle, using an internal servo control processor requiring little external microcontroller intervention.

Servo data is received from each of the six photodiodes 101 and then amplified by six VGAs 301. As a result, the following ADCs 302 only require 60 dB of dynamic range, because servo VGAs 301 boost the input signal by as much as 28 dB. VGAs 301 also incorporate low pass filtering (LPF) for anti-aliasing. Preferably three pole filters are used with one pole in front of the VGAs and two poles after the VGAs.

Analog to digital conversion is done immediately after low pass filtering such that the analog/digital boundary is as close to the input as possible. An input sampling frequency of 24 MHz (generated on-chip by sample rate generator 303) and a third order delta-sigma modulator reduce digital filter group delay inside the servo loop.

Servo data processing is performed by on-board servo control processor (SCP) 304, which receives its instruction set from the user selected local microcontroller 106 through interface 107 and RAM 305.

Unlike CD systems, DVD servo systems use differential phase detection (DPD) between the photodiode signals D1,D2 (D1=A+C, D2=B+D) for track following and track counting. A digital adaptive dual arm correlator (ADAC) is implemented. This is superior to the conventional DPD methods based on a simple phase detector and analog filters.

Analog control signals are transmitted to power amplifiers 102 through DAC array 306 and spindle control 307.

According to the principles of the present invention, signals are transmitted across the flexible cable in an optical disk system as currents rather than voltages. The voltage signals can then be recovered at the receiving end using a low impedance load. By using current, wide dynamic range can be achieved without sacrificing the signal to noise ratio. One embodiment of these principles is depicted in FIG. 4A.

Figure 4B:
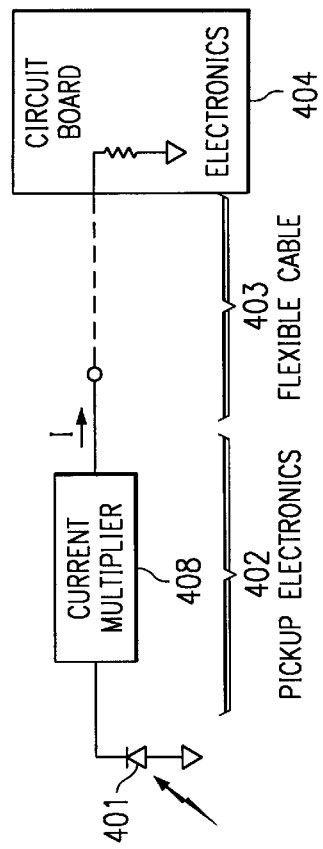
FIG. 4B illustrates an alternative current mode signal transmission/reception system.
Figure 4A:
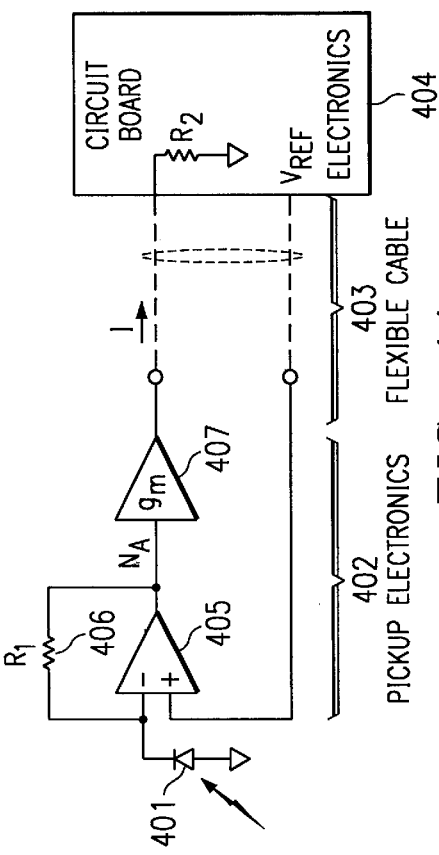
FIG. 4A is a more detailed functional block diagram of a current mode signal transmission/reception system suitable for use in the system of FIG. 1.

FIG. 4A is a more detailed functional block diagram of a current mode signal transmission/reception system 400 according to the inventive concepts. The current output from the corresponding diode 401, which is approximately 1–10 $\mu$A, is converted into a voltage and amplified by a transimpedance amplifier consisting of an operational amplifier 405 and a feedback resistor 406. The feedback resistor may for example be on the order of 4k ohms. The output voltage VA from operational amplifier 405 may be on the order 500 to 600 mV.

The output from the transimpedance amplifier is reconverted to current and amplified by a transconductance amplifier 407. Transconductance amplifier 407 outputs the signal at approximately 100 $\mu$A for transmission across a corresponding conductor of the flexible cable 403. Prior to transmission, the currents representing the various diodes may be summed to generate composite signals for transmission on a reduced number of conductors. For example, the currents output from the transconductance amplifiers associated with photodiodes A, B, C, D, E, and F may be summed to produce a composite signal for delivery to servo control channel 300.

An alternative configuration is shown in FIG. 4B. Here, the current output from the given photodiode 401 is directly multiplied by a current multiplier 408 and transmitted across flexible cable 403. While FIG. 4B depicts single-ended transmission, differential transmission can be used equally as well. Again, the currents generated by the multiplier 408 corresponding to different diodes may be summed to generate composite signals for transmission to fixed circuit board 404.

Figure 5:
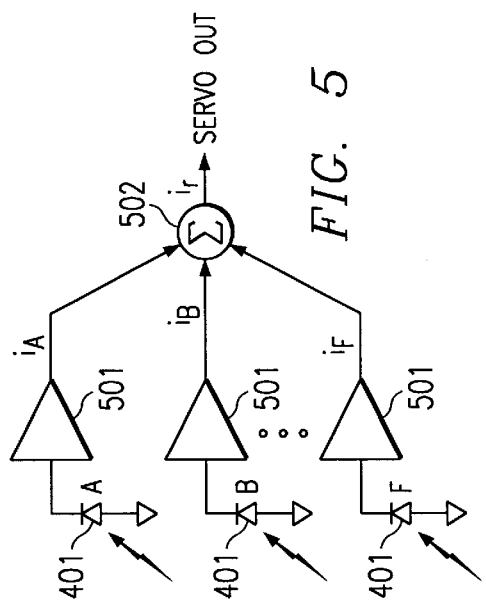
FIG. 5 depicts the summing of currents to generate composite signals for reducing the number of conductors required in the flexible cables of FIGS. 4A and 4B.

FIG. 5 illustrates the summing of currents to generate composite signals for reducing the number of conductors required in the flexible cables. Adding currents also decreases the required headroom that would normally be required if voltages were summed. Here, each diode 401 is coupled to a current driver 501. Drivers 501 may, for example, be constructed as the transimpedance-transconductance amplifier pair discussed above or a current multiplier. In any event, the currents produced from the electrical signals output from the corresponding diodes are summed by summer 502. In this example, the outputs from diodes A–F are being summed together to produce a composite servo control signal at output SERVO OUT. This signal is sent to the input of servo channel 300, with summation at the fixed circuit board no longer required. Again, a low impedance load can be used to convert the received current signal to a voltage signal to continue data processing.

Although the invention has been described with reference to a specific embodiment, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed:

1. An optical disk pickup system comprising:
   a photodiode for converting photons reflected from an optical disk into a current;
   a transimpedance amplifier for converting the current from the photodiode into a voltage signal; and
   a transconductance amplifier for driving a conductive line of a flexible cable with a current generated from the voltage signal.

2. The optical disk pickup system of claim 1 wherein the transimpedance amplifier comprises an operational amplifier and a resistive feedback loop.

3. The optical disk pickup system of claim 1 further comprising a low impedance load disposed in receiving circuitry coupled to the conductor for reconverting the current driven on the conductor into a voltage.

4. The optical disk pickup system of claim 1 and further comprising a summer for summing the current from the transconductance amplifier with two or more currents generated from the output of two or more photodiodes.

5. The optical disk pickup system of claim 1 wherein the conductive line of the flexible cable comprises one of a plurality of conductors of a the flexible cable.

* * * * *

UNITED STATES PATENT AND TRADEMARK OFFICE
CERTIFICATE OF CORRECTION

PATENT NO. : 6,650,614 B1 Page 1 of 1
APPLICATION NO. : 09/702240
DATED : November 18, 2003
INVENTOR(S) : David Michael Pietruszynski and Rex Baird It is certified that error appears in the above-identified patent and that said Letters Patent is hereby corrected as shown below:

At column 5, lines 25-26, delete "08/956,567" and insert -- 08/956,569 --.

Signed and Sealed this

Twenty-first Day of July, 2009

JOHN DOLL
*Acting Director of the United States Patent and Trademark Office*